United States Patent [19]
Roberts

[11] 3,969,555
[45] July 13, 1976

[54] ALUMINUM PLATING CORROSION RESISTANCE
[75] Inventor: Charles B. Roberts, Midland, Mich.
[73] Assignee: The Dow Chemical Company, Midland, Mich.
[22] Filed: Mar. 30, 1972
[21] Appl. No.: 239,959

[52] U.S. Cl.................................. 427/383; 427/252
[51] Int. Cl.² .......................................... B05D 3/02
[58] Field of Search.......... 117/130 R, 160 R, 47 A, 117/47 R, 50, 107.2 R; 48/6.27, 6.3; 427/252, 383

[56] References Cited
UNITED STATES PATENTS

| | | | |
|---|---|---|---|
| 2,921,868 | 1/1960 | Berger............................ | 117/130 R |
| 3,375,129 | 3/1968 | Carley et al..................... | 117/130 R |
| 3,449,144 | 6/1968 | Williams et al................. | 117/160 R |
| 3,462,288 | 8/1969 | Schmidt et al.................. | 117/37 R |
| 3,674,541 | 7/1972 | Ichiki et al...................... | 117/160 R |
| 3,698,940 | 10/1972 | Mersereau et al............... | 117/213 |

Primary Examiner—William A. Powell
Assistant Examiner—Michael W. Ball
Attorney, Agent, or Firm—R. W. Selby; J. M. Kuszaj

[57] ABSTRACT

A process to improve the corrosion resistance of an aluminum plate deposited on a substrate by the catalytic decomposition of an aluminum hydride. The process preferably involves heating at least the aluminum plate to a temperature of at least about 50°C. for from about 4 to about 24 hours.

6 Claims, No Drawings

ALUMINUM PLATING CORROSION RESISTANCE

BACKGROUND OF THE INVENTION

This invention relates to heat treating and more in particular pertains to a heat treating process to improve the corrosion resistance of an aluminum plate on a substrate.

It has been found that an aluminum plate deposited on a substrate substantially in accord with the process of Schmidt et al., U.S. Pat. No. 3,462,288, occasionally develops corrosion in a plurality of spaced apart locations after an extended period of exposure to the ambient atmosphere. The isolated points of corrosion have become known as pinholes in the aluminum plate. It is desirable that a process be developed to minimize such pinhole formation.

SUMMARY OF THE INVENTION

Although the specific cause of the occasional formation of corrosion spots on aluminum plating produced by the aforereferenced process has not been conclusively determined, the following process reduces the propensity of the described aluminum plate to corrode. The improvement comprises heat treating at least the aluminum plating on the substrate at a temperature and for a time sufficient to improve the corrosion resistance of the aluminum plate. Preferably, the temperature is at least about 50°C. and the exposure time is at least about one-half hour and more preferably from about 4 to about 24 hours.

The temperature should be less than that necessary to deleteriously effect the usefulness of either the aluminum plate or the aluminum plated substrate. Preferably, the maximum temperature is about 150°C. and more preferably 110°C. The desired heat can be provided by means such as gas or oil burners, electric heating elements, heat lamps and the like.

The substrate is plated by first contacting the substrate with a decomposition catalyst and then with an aluminum hydride for a time sufficient to deposit metallic aluminum onto the substrate. Decomposition catalysts include compounds of titanium, zirconium, hafnium, vanadium, niobium and tantalum. Generally the heat treatment is carried out prior to visual observance of aluminum corrosion and preferably within about 24 hours and more preferably substantially immediately after the plating operation has been completed.

The following examples further illustrate the effectiveness of the described process to improve the corrosion resistance of the described aluminum plating.

A 0.0005 inch thick Mylar film was plated with aluminum by catalytically decomposing $AlH_3$ with $TiCl_4$. The plated film was placed in an electric furnace and heated to 100°C. for about 8 hours. The aluminum plate heated in the furnace was free of corrosion after the 8 hour exposure period. A comparative, unheated specimen developed pinholes during exposure to the room atmosphere for the same time period. The heated specimen was reheated at 100°C. for about 16 hours, removed from the furnace and then cooled to room temperature. The reheated aluminum plated specimen has remained visually free of pinholes after exposure to the ambient atmosphere for almost 1 year.

In a similar manner, individual samples of aluminum plated Mylar are exposed to elevated temperatures of 50°C., 80°C. and 140°C. for periods of 16 hours. The room temperature, pinhole corrosion resistance of the aluminum plated samples will improve.

What is claimed is:

1. In a process for the plating of aluminum onto a substrate comprising sequentially contacting an aluminum hydride and a decomposition catalyst selected from the group consisting of a compound of titanium, zirconium, hafnium, vanadium, niobium and tantalum, in the presence of each other, with the substrate for a time sufficient to deposit metallic aluminum onto the substrate, the improvement consisting of subsequently heat treating at least the deposited metallic aluminum at a temperature of from about 50° to about 150°C. and for a time sufficient to improve the corrosion resistance of the deposited metallic aluminum.

2. The improvement of claim 1 wherein the aluminum is heated for at least about one-half hour.

3. The improvement of claim 1 wherein the aluminum is heated for from about 4 to about 24 hours.

4. The improvement of claim 1 wherein the aluminum is heated at a temperature of from about 50° to about 110°C.

5. The improvement of claim 4 wherein the aluminum is heated for at least about one-half hour.

6. The improvement of claim 4 wherein the aluminum is heated for from about 4 to about 24 hours.

* * * * *